United States Patent
Xue et al.

(10) Patent No.: US 9,461,233 B2
(45) Date of Patent: Oct. 4, 2016

(54) HIGH-TEMPERATURE SUPERCONDUCTING FILM

(71) Applicants: Tsinghua University, Beijing (CN); Institute of Physics, Chinese Academy of Sciences, Beijing (CN)

(72) Inventors: Qi-Kun Xue, Beijing (CN); Xu-Cun Ma, Beijing (CN); Li-Li Wang, Beijing (CN); Xi Chen, Beijing (CN); Jin-Feng Jia, Beijing (CN); Ke He, Beijing (CN); Shuai-Hua Ji, Beijing (CN); Wen-Hao Zhang, Beijing (CN); Qing-Yan Wang, Beijing (CN); Zhi Li, Beijing (CN)

(73) Assignees: Tsinghua University, Beijing (CN); Institute of Physics, Chinese Academy of Sciences, Beijing (CN)

( * ) Notice: Subject to any disclaimer, the term of this patent is extended or adjusted under 35 U.S.C. 154(b) by 211 days.

(21) Appl. No.: 14/316,822

(22) Filed: Jun. 27, 2014

(65) Prior Publication Data

US 2015/0380129 A1 Dec. 31, 2015

(51) Int. Cl.
*H01L 39/24* (2006.01)
*H01L 39/12* (2006.01)
*H01L 39/14* (2006.01)
*H01B 13/00* (2006.01)
*H01B 12/06* (2006.01)

(52) U.S. Cl.
CPC ............... *H01L 39/12* (2013.01); *H01L 39/14* (2013.01); *H01B 12/06* (2013.01); *H01B 13/0036* (2013.01)

(58) Field of Classification Search
CPC .......................... H01B 12/06; H01B 13/0036
USPC .................................................. 505/410
See application file for complete search history.

(56) References Cited

U.S. PATENT DOCUMENTS

2013/0196856 A1* 8/2013 Li .................. H01L 39/125
505/191

OTHER PUBLICATIONS

"Electric phase diagram of NaFe1—xCoxAs investigated by scanning tunneling microscopy." Zhou Xiao-Dong et al. Chin. Phys. B vol. 22, No. 8 (2013).*
Qingyan Wang et al.; "Interface-induced high-temperature superconductivity in single unit-cell FeSe films on SrTiO3"; Chinese Physics Letters, vol. 29, No. 3, Mar. 2012.

* cited by examiner

*Primary Examiner* — Paul Wartalowicz
(74) *Attorney, Agent, or Firm* — Zhigang Ma

(57) ABSTRACT

A high-temperature superconducting film includes a $SrTiO_3$ substrate, a single crystalline FeSe layer, and a protective layer with a layered crystal structure. The single crystalline FeSe layer is sandwiched between the $SrTiO_3$ substrate and the protective layer via a layer-by-layer mode. An onset temperature of superconducting transition of the high-temperature superconducting film is greater than or equal to 54 K, and a critical current density of the high-temperature superconducting film is about $10^6$ A/cm$^2$ at 12 K.

19 Claims, 7 Drawing Sheets

HIGH-TEMPERATURE SUPERCONDUCTING FILM

CROSS-REFERENCE TO RELATED APPLICATIONS

This application is related to commonly-assigned application Ser. No. 14/316,823 entitled, "METHOD FOR MAKING HIGH-TEMPERATURE SUPERCONDUCTING FILM". Disclosures of the above-identified applications are incorporated herein by reference.

FIELD

The present application relates to a high-temperature superconducting film.

BACKGROUND

High temperature superconductor is an unconventional superconductor which cannot be explained by conventional BCS theory. In 1986, Muler and Bednorz firstly discovered cuprate high-temperature superconductors. In 2008, physicists in Japan firstly discovered iron-based high-temperature superconductors. This provides a new system for studying mechanism of superconductivity and gives inspiration to explore other high-temperature superconducting materials.

The iron-based high-temperature superconductors and cuprate high-temperature superconductors have some resemblances in structure. All of them own layered heterostructures with one conducting layer sandwiched between two insulating layers.

In addition, high temperature superconducting materials usually are synthetized by high temperature reaction, single crystalline or polycrystalline. However, bulk materials are known to suffer from great fluctuations in stoichiometry, disorder, and clustering pathologies with many defects and impurities. At present, iron-based high-temperature superconducting films can be prepared by Pulsed Laser Deposition (PLD). However, these iron-based high-temperature superconducting films usually comprise inhomogeneous structure and many impurities, which may affect studying the mechanism of high-temperature superconductivity.

What is needed, therefore, is to provide a high-temperature superconducting film which can overcome the shortcomings as described above.

BRIEF DESCRIPTION OF THE DRAWINGS

Implementations of the present technology will now be described, by way of example only, with reference to the attached figures, wherein.

DETAILED DESCRIPTION

Figure 1:
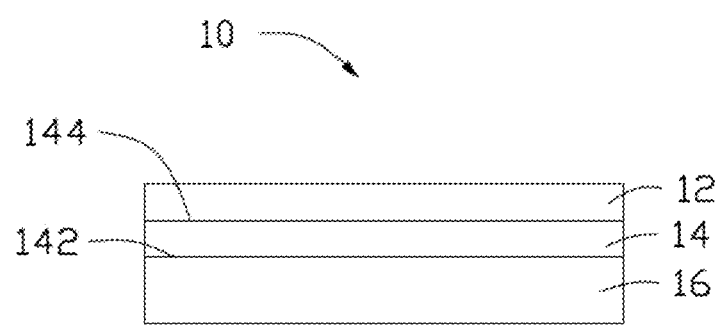
FIG. 1 is a schematic view of one embodiment of a high-temperature superconducting film.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like.

Referring to FIG. 1, an iron-based high-temperature superconducting film 10 includes a $SrTiO_3$ substrate 16, a single crystalline FeSe layer 14, and a protective layer 12. The single crystalline FeSe layer 14 and the protective layer 12 are epitaxially grown on the $SrTiO_3$ substrate 16 via a typical layer-by-layer mode. The single crystalline FeSe layer 14 is sandwiched between the $SrTiO_3$ substrate 16 and the protective layer 12. A first interface 142 between the $SrTiO_3$ substrate 16 and the single crystalline FeSe layer 14 is atomically smooth. A second interface 144 between the single crystalline FeSe layer 14 and a protective layer 12 is also atomically smooth, basically no ion intermixing on atomic scale.

The $SrTiO_3$ substrate 16 has a relatively high dielectric constant at low temperature, which is beneficial to screen interaction between carriers. The $SrTiO_3$ substrate 16 can be insulating, which is good for measuring the superconducting transition temperature of the high-temperature superconducting film 10 by electrical transport measurement. A thickness of the $SrTiO_3$ substrate 16 can be in a range from about 0.2 millimeters (mm) to about 1.0 mm. In one embodiment, the thickness of the $SrTiO_3$ substrate 16 is about 0.5 mm.

The $SrTiO_3$ substrate 16 has a layered crystal structure, which is formed by alternatively stacking a titanium dioxide ($TiO_2$) layer and a strontium oxide (SrO) layer. A crystal lattice of the $SrTiO_3$ substrate 16 in the (100) crystal plane is a tetragonal lattice, with a lattice constant of 0.3905 nm. The lattice mismatch between the $SrTiO_3$ substrate 16 and the single crystalline FeSe layer 14 is about 3%, which is good for high-quality single crystalline FeSe layer 14 grown on the (100) crystal plane of the $SrTiO_3$ substrate 16.

The single crystalline FeSe layer 14 has a layered crystal structure in a tetragonal lattice, with the lattice constant 0.378 nm in the (100) crystal plane. A thickness of the single crystalline FeSe layer 14 is in a range from about 1 unit-cell (UC) to about 5 UC. Along the (001) crystal direction, one UC thick FeSe film consists of a Se—Fe—Se triple layer, where two adjacent Fe atoms are bonded by covalent bonds in the Fe atom layer and each two Se atoms are bonded to the Fe atoms by covalent bonds above and below the planar Fe layer, respectively. Two adjacent triple layers are bonded by Van der Waals force. In one embodiment, the single crystalline FeSe layer 14 is a 1 UC thick FeSe single crystalline film.

The superconducting transition temperature is enhanced by interface effect at the first interface 142. When the single crystalline FeSe layer 14 is 1 UC thick, the superconducting transition temperature reaches the highest value. When the thickness of the single crystalline FeSe layer 14 becomes thicker, the superconducting transition temperature of the high-temperature superconducting film 10 decreases because of proximity effect.

The protective layer 12 has a layered crystal structure with tetragonal lattice. The tetragonal lattice layered compound is composed by A and B, wherein A is a transition metal, B is selenium (Se), tellurium (Te), or sulfur (S). In one embodiment, the protective layer 12 is a single crystalline FeTe layer. The single crystalline FeTe layer is non-superconducting. A thickness of the single crystalline FeTe layer can be in a range from about 2 UC to about 10 UC. In one embodiment, the thickness of the single crystalline FeTe layer is 10 UC, to protect the single crystalline FeSe layer 14. Thus, the single crystalline FeSe layer 14 is prevented from oxidation and adsorbing impurities such as water vapor in air.

For the protective layer 12 and the single crystalline FeSe layer 14, their crystal structure is the same, and their lattice mismatch is less than 5%, consequently the second interface 144 formed between the protective layer 12 and the single crystalline FeSe layer 14 is atomically smooth. The protective layer 12 can fully cover the single crystalline FeSe layer 14, and directly contact the whole single crystalline FeSe layer 14.

The first interface 142 is in favor of the heterointerface of the FeSe/SrTiO3 to produce a strong interface-enhanced superconductivity effect. The second interface 144 can minimize external factors influencing the interface-enhanced superconductivity effect.

Figure 2:
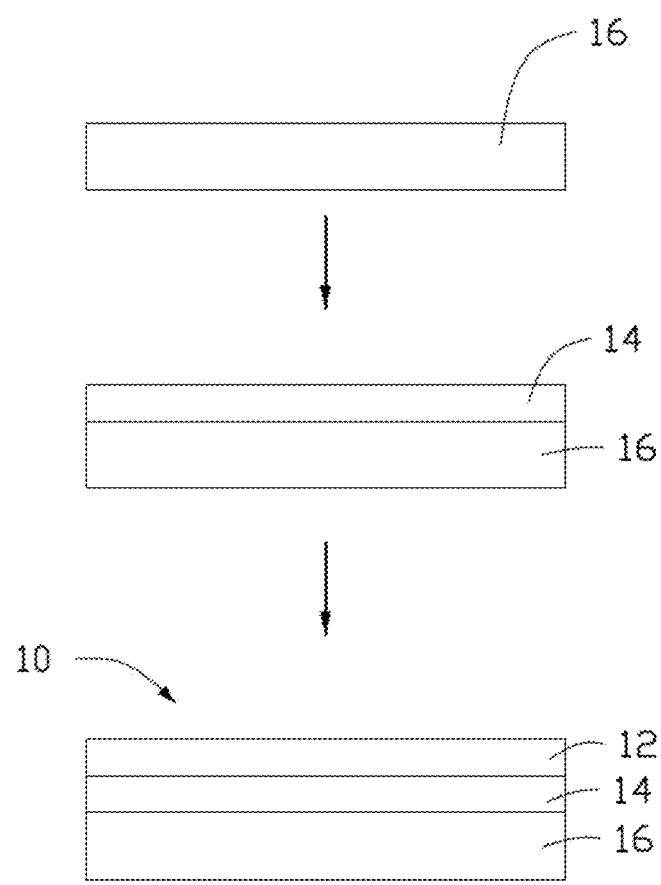
FIG. 2 is a schematic process flow of one embodiment of a method for making the high-temperature superconducting film of FIG. 1.

Referring to FIG. 2, one embodiment of a method for making the high-temperature superconducting film 10 of includes:

(S1) loading a $SrTiO_3$ substrate 16 into an ultra-high vacuum (UHV) system;

(S2) growing a single crystalline FeSe layer 14 on a surface of the $SrTiO_3$ substrate 16 by molecular beam epitaxy (MBE); and (S3) growing a protective layer 14 with a layered crystal structure by MBE and covering the single crystalline FeSe layer 14.

In the step (S1), before loading the $SrTiO_3$ substrate 16 in an UHV system, the $SrTiO_3$ substrate 16 is successively treated by deionized water, acid, and high temperature annealing in oxygen atmosphere, to obtain a single $TiO_2$ terminated surface and atomically flat steps on the $SrTiO_3$ substrate 16. Thus, high-quality single crystalline FeSe layer 14 and an atomically smooth interface can be formed.

The $SrTiO_3$ substrate 16 is treated by deionized water. The $SrTiO_3$ substrate 16 can be kept in deionized water for about 40 min to about 80 min, wherein a temperature of the deionized water can be in a range from about 70 degrees Celsius to about 100 degrees Celsius. In one embodiment, the $SrTiO_3$ substrate 16 is kept in the deionized water at about 80 degrees Celsius for about 60 min. The purpose of treating by deionized water is to promote the adsorption of more $OH^-$ on a surface of the $SrTiO_3$ substrate 16 and formation a strontium hydroxide $(Sr(OH)_2)$ with SrO on the surface of the $SrTiO_3$ substrate 16.

The $SrTiO_3$ substrate 16 is treated by acid. That is, the surface of the $SrTiO_3$ substrate 16 can be etched by hydrochloric acid (HCl) or hydrofluoric acid (HF), to neutralize $Sr(OH)_2$ on the surface of the $SrTiO_3$ substrate 16. In one embodiment, the surface of the $SrTiO_3$ substrate 16 is etched by hydrochloric acid. The $SrTiO_3$ substrate 16 treated by deionized water is kept in hydrochloric acid for about 30 min to about 60 min, wherein a concentration of the hydrochloric acid can be in a range from about 8% to about 12%. In one embodiment, the $SrTiO_3$ substrate 16 treated by deionized water is etched in hydrochloric acid for about 45 min, wherein the concentration of the hydrochloric acid is 10%.

The $SrTiO_3$ substrate 16 is annealed at a high temperature in oxygen atmosphere. That is, after being etched by acid and dried by nitrogen, the $SrTiO_3$ substrate 16 can be annealed in a pure oxygen atmosphere for about 2.5 hours to about 3.5 hours. The annealing temperature can be in a range from about 950 degrees Celsius to about 1000 degrees Celsius. In one embodiment, the $SrTiO_3$ substrate 16 can be placed in a high temperature tube furnace. The $SrTiO_3$ substrate 16 is annealed to high temperature in oxygen atmosphere, and cooled to room temperature. In one embodiment, the $SrTiO_3$ substrate 16 is heated at 980 degrees Celsius for about 3 hours. Wherein a heating rate is about 0.833 degrees Celsius per minute (/min) at a temperature from about 50 degrees Celsius to about 105 degrees Celsius, the heating rate is about 9.210 degrees Celsius per minute at temperatures from about 105 degrees Celsius to about 980 degrees Celsius, a cooling rate is about 5 degrees Celsius per minute, and oxygen flow is about 38 milliliters per minute. The purpose of treating the $SrTiO_3$ substrate 16 at high temperature with oxygen is to form regular steps on the surface of the $SrTiO_3$ substrate 16 and keep the $SrTiO_3$ substrate 16 insulating, which is propitious to prepare atomically flats on the FeSe film and performing the transport measurements.

The UHV facility is a system with base pressure less than $10^{-7}$ Pa. In one embodiment, the base pressure is $2.0 \times 10^{-8}$ Pa. A molecular beam epitaxy device is located in the UHV system.

After loading the $SrTiO_3$ substrate 16 into the UHV system, the $SrTiO_3$ substrate 16 is degassed at a temperature from about 600 degrees Celsius to about 650 degrees Celsius for a time in the range of from about 2.5 hours to about 3.5 hours, to remove the impurities absorbed on the surface of the $SrTiO_3$ substrate 16 in an atmosphere. In one embodiment, the $SrTiO_3$ substrate 16 is degassed at about 600 degrees Celsius for about 3 hours.

In the step (S2), in the process of growth by MBE, the $SrTiO_3$ substrate 16 is held at a temperature from about 380 degrees Celsius to about 420 degrees Celsius. A Fe source and a Se source are provided, wherein a flux ratio of the Fe source and the Se source can be in a range from about 1:10 to about 1:20. The evaporated temperature of the Fe source can be in a range from about 1000 degrees Celsius to about 1100 degrees Celsius. The evaporated temperature of the Se source can be in a range from about 130 degrees Celsius to about 150 degrees Celsius. The growth rate of the single crystalline FeSe layer 14 is about 0.25 UC per minute. In one embodiment, the growth rate ratio of the Fe source and the Se source is about 1:10, the $SrTiO_3$ substrate 16 is held at about 400 degrees Celsius, the evaporated temperature of the Fe source is about 1080 degrees Celsius, and the evaporated temperature of the Se source is about 138 degrees Celsius. The parameters above can improve the quality of the single crystalline FeSe layer 14, further increasing the superconducting transition temperature of the high-temperature superconducting film 10.

When the growth rate of the single crystalline FeSe layer 14 is about 0.25 UC per minute, a thickness of the single crystalline FeSe layer 14 can be controlled by the growth time. When the thickness is about 1 UC, the growth time is about 4 min. When the thickness is about 5 UC, the growth time is about 20 min.

After growing the single crystalline FeSe layer 14, an entirety including the $SrTiO_3$ substrate 16 and the single crystalline FeSe layer 14 is annealed at a temperature from about 450 degrees Celsius to about 550 degrees Celsius for from about 20 hours to about 30 hours. In one embodiment, the entirety including the $SrTiO_3$ substrate 16 and the single crystalline FeSe layer 14 is annealed for about 25 hours at about 500 degrees Celsius. The purpose of annealing the entirety including the $SrTiO_3$ substrate 16 and the single crystalline FeSe layer 14 is to remove redundant Se and improving a strong bond between the single crystalline FeSe layer 14 and the $SrTiO_3$ substrate 16, which is good for the high-temperature superconducting film 10 to obtain a stronger interface enhancement superconducting effect.

In the step (S3), the protective layer 12 is a single crystalline FeTe layer. In the process of growth by MBE, the $SrTiO_3$ substrate 16 is held at a temperature from about 310 degrees Celsius to about 330 degrees Celsius. A Fe source and a Te source are provided, wherein a flux ratio of the Fe source and the Te source can be in a range from about 1:10 to about 1:20. An evaporated temperature of the Fe source can be in a range from about 1000 degrees Celsius to about 1100 degrees Celsius. An evaporated temperature of the Te source can be in a range from about 240 degrees Celsius to about 280 degrees Celsius. A growth rate of the single crystalline FeTe layer is about 0.25 UC per minute. In one embodiment, the flux ratio of the Fe source and the Te source is about 1:10, the $SrTiO_3$ substrate 16 is held at about 320 degrees Celsius, the evaporated temperature of the Fe source is about 1070 degrees Celsius, and the evaporated temperature of the Te source is about 248 degrees Celsius. Under above parameters, high quality single crystalline FeTe layer can be prepared. The single crystalline FeSe layer 14 can be protected by the single crystalline FeTe layer.

When the growth rate of the single crystalline FeTe layer is about 0.25 UC per minute, a thickness of the single crystalline FeTe layer can be controlled by the growing time. When the thickness is about 2 UC, the growing time is about 8 min. When the thickness is about 10 UC, the growth time is about 40 min.

Figure 3:
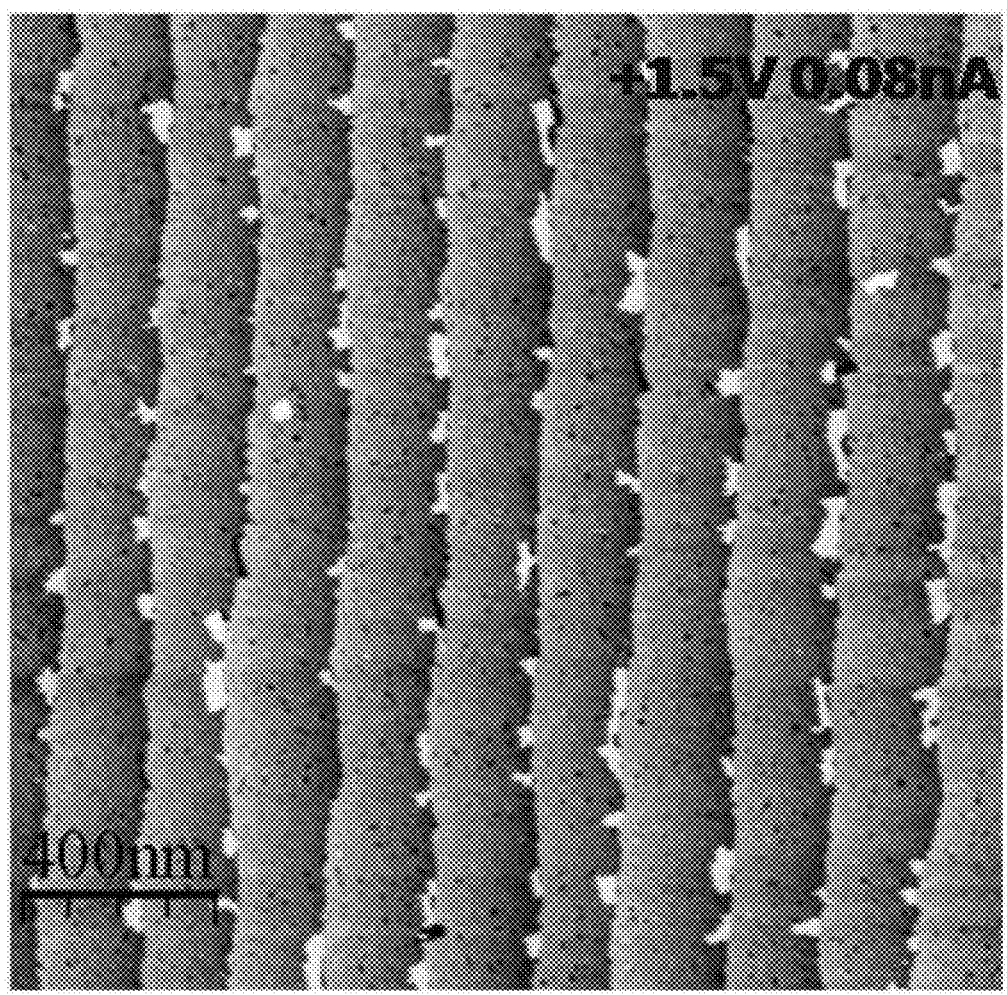
FIG. 3 shows a scanning tunneling microscope (STM) topographic image of a single crystalline FeSe layer of the high-temperature superconducting film of FIG. 1.

Referring to FIG. 3, an STM topographic image of the single crystalline FeSe layer 14 without the protective player 12 is shown, wherein the thickness of the single crystalline FeSe layer 14 is 1 UC. The single crystalline FeSe layer 14 has regular steps, originating from the $SrTiO_3$ substrate 16, as shown in FIG. 3.

Figure 4:
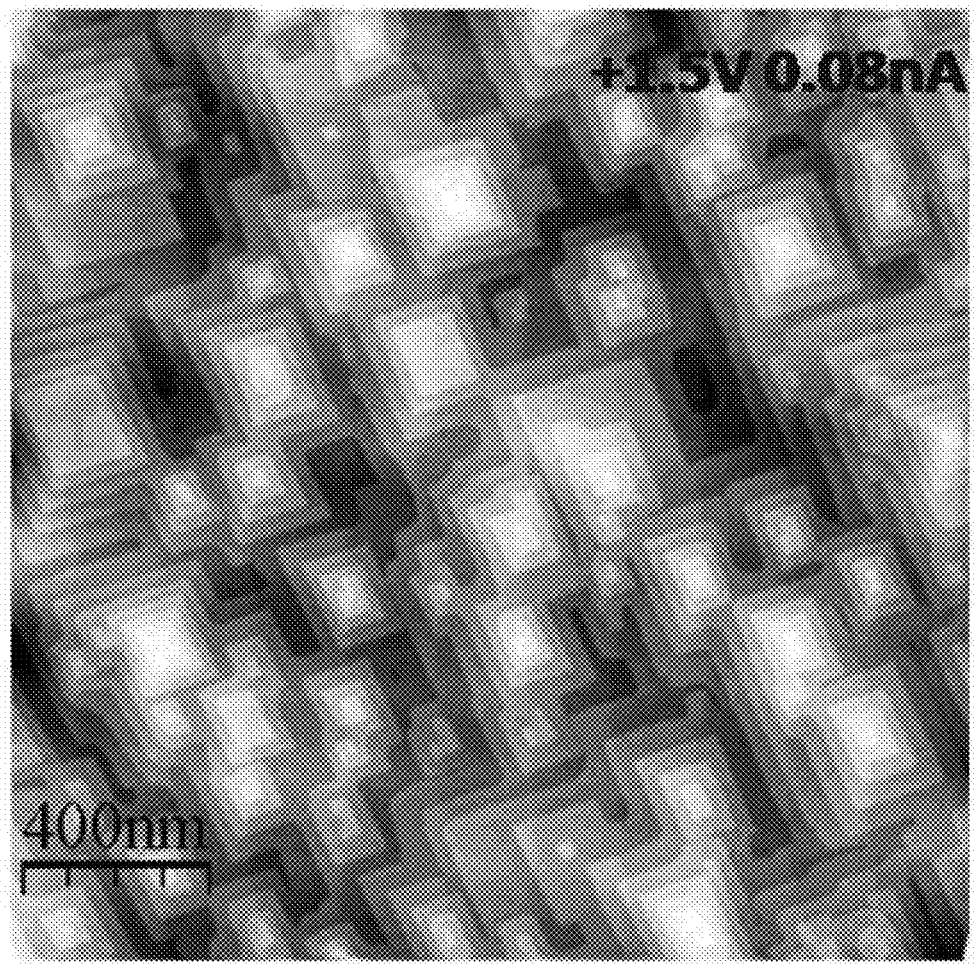
FIG. 4 shows a scanning tunneling microscope (STM) topographic image of the single crystalline FeSe layer of FIG. 3 covered by a protective layer.

Referring to FIG. 4, an STM topographic image of the single crystalline FeSe layer 14 covered by the protective player 12 is shown, wherein the thickness of the single crystalline FeTe layer is 10 UC. The single crystalline FeSe layer 14 is uniformly and completely covered by the single crystalline FeTe layer.

Figure 5:
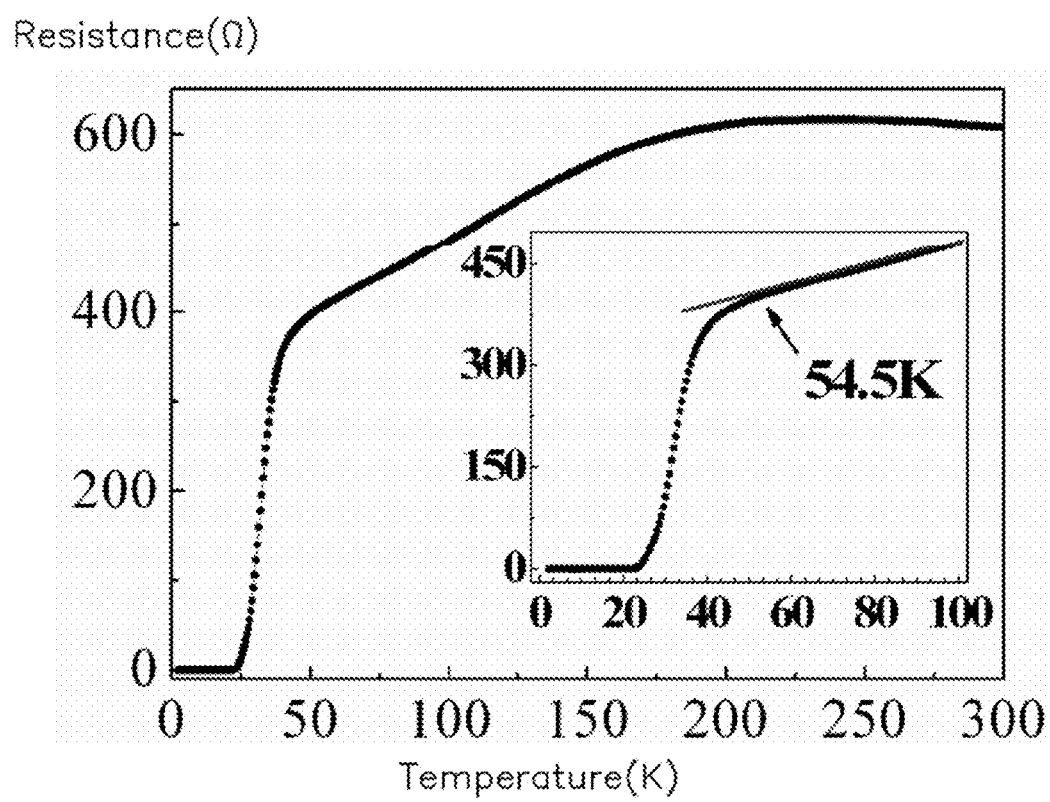
FIG. 5 shows an ex situ electrical transport measurement of the high-temperature superconducting film of FIG. 1.

Referring to FIG. 5, an ex situ electrical transport measurement of the high-temperature superconducting film 10 is shown, wherein the thickness of the single crystalline FeSe layer 14 is 1 UC, and the thickness of the single crystalline FeTe layer is 10 UC. Since the $SrTiO_3$ substrate 16 is insulating, and neither the protective FeTe layer 12 nor the STO substrate 16 becomes superconducting due to proximity effect, so the superconductivity is confined to the 1 UC single crystalline FeSe layer 14. As shown in FIG. 5, the resistance of high-temperature superconducting film 10 drops with decreasing temperature, and exhibits superconducting transition at low temperature. An onset temperature of the superconducting transition can be about 54.5 K. The resistance of the high-temperature superconducting film 10 completely reduces to zero at about 24 K.

Figure 6:
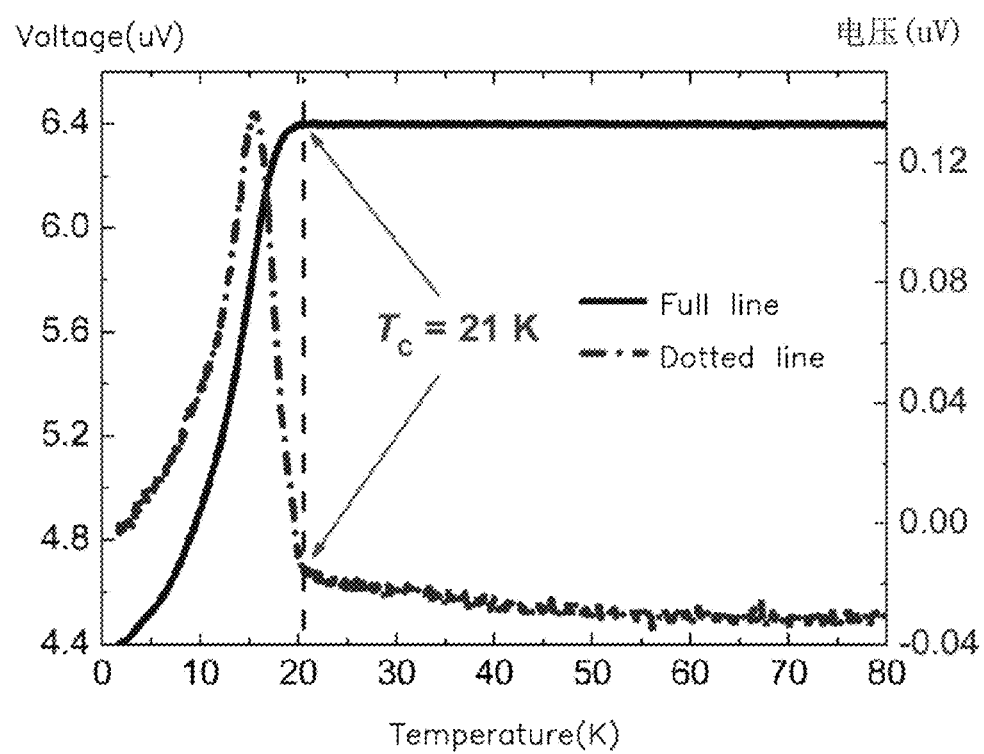
FIG. 6 shows a diamagnetism measurement of the high-temperature superconducting film of FIG. 1.

Referring to FIG. 6, a diamagnetism measurement of the high-temperature superconducting film 10 is shown, wherein the thickness of the single crystalline FeSe layer 14 is 1 UC, and the thickness of the single crystalline FeTe layer is 10 UC. The real part of the inductance voltage is represented by a solid line, and the imaginary part of the inductance voltage is represented by a dotted line. The high-temperature superconducting film 10 appears to show perfect diamagnetism at a temperature about 21 K, which corresponds to the temperature when the resistance becomes zero as shown in FIG. 5.

Figure 7:
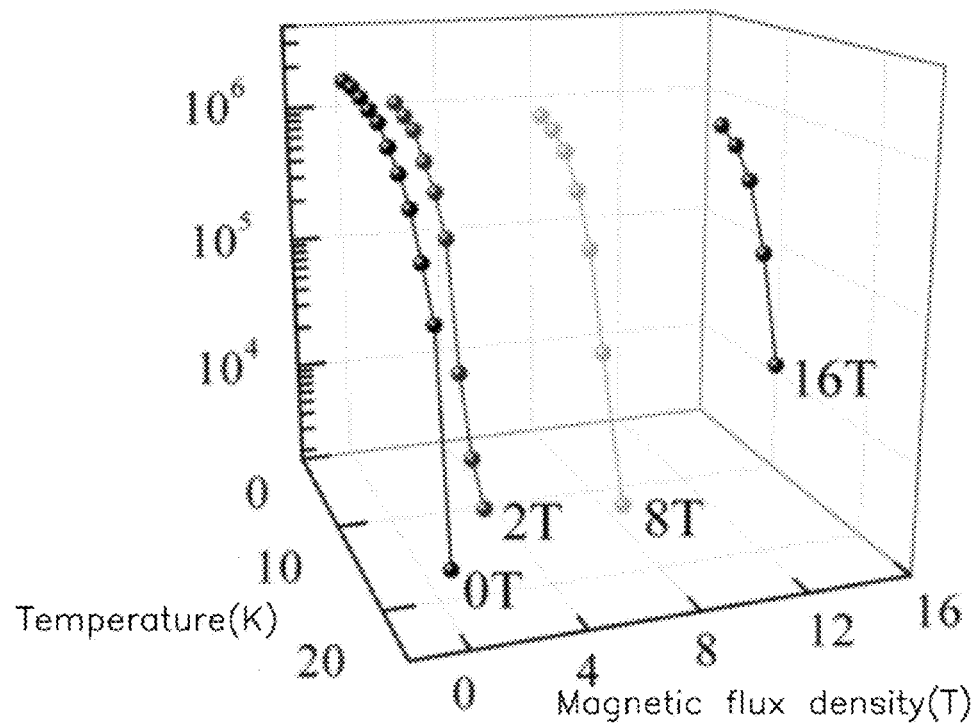
FIG. 7 shows a critical current density measurement of the high-temperature superconducting film of FIG. 1.

Referring to FIG. 7, it shows a critical current density measurement of the high-temperature superconducting film 10, wherein the thickness of the single crystalline FeSe layer 14 is 1 UC, and the thickness of the single crystalline FeTe layer is 10 UC. In zero field, the critical current density of the high-temperature superconducting film 10 is about $10^6$ ampere per square centimeter ($A/cm^2$) at 12 K. The critical current density of the high-temperature superconducting film 10 still remains about $10^5$ $A/cm^2$ at 8 K and 16 T.

In summary, the lattice mismatch between $SrTiO_3$ and the single crystalline FeSe is small, wherein the $SrTiO_3$ (100) functions as a substrate. Thus, FeSe can be grown by MBE on the surface of $SrTiO_3$ in a layer-by-layer mode. The $SrTiO_3$ substrate 16 has a high dielectric constant at low temperature, which is beneficial to screen interaction between carriers and get strong $FeSe/SrTiO_3$ interface-enhanced superconducting effect. Furthermore, the single crystalline FeSe layer 14 can be atomically flat and prevented from oxidation and adsorbing impurities in air by single crystalline FeTe layer 12 as protective layer, which results in reducing the electron scattering at the interface between the single crystalline FeSe layer 14 and the protective layer 12, preserving the superconductivity of the single crystalline FeSe layer 14. Both the interface between the single crystalline FeSe layer 14 and the protective layer 12 and the interface between the single crystalline FeSe layer 14 and the $SrTiO_3$ substrate 16 are atomically smooth. Moreover, the onset temperature of the superconducting transition of the high-temperature superconducting film 10 is no less than 54 K. The critical current density of the high-temperature superconducting film 10 is about $10^6$ $A/cm^2$ at 12 K. In addition, 1-UC FeSe on $SrTiO_3$ exhibits different electronic structures and thus different superconductivity mechanisms from those of bulk FeSe, which renders additional support to the interface enhanced electron-phonon coupling effect. The FeSe/SrTiO$_3$ system can possibly be used to understand the pairing mechanism of cuprates such as BSCCO because two systems have the similar structure consisting of a charge-reservoir layer (STO in the present case and BiSrO in BSCCO) and a superconducting layer (FeSe in the present case and CuO$_2$ in BSCOO).

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A high-temperature superconducting film, comprising: a SrTiO$_3$ substrate, a single crystalline FeSe layer, and a protective layer with a layered crystal structure, wherein the single crystalline FeSe layer is sandwiched between the SrTiO$_3$ substrate and the protective layer via a layer-by-layer mode; and the protective layer is formed by a tetragonal lattice layered compound AB, A is a transition metal; and B is selenium, tellurium, or sulfur.

2. The high-temperature superconducting film of claim 1, wherein the protective layer is a single crystalline FeTe layer.

3. The high-temperature superconducting film of claim 2, wherein a thickness of the single crystalline FeTe layer is in a range from about 2 unit-cells thick to about 10 unit-cells thick.

4. The high-temperature superconducting film of claim 2, wherein a thickness of the single crystalline FeTe layer is about 10 unit-cells thick, and a thickness of the single crystalline FeSe layer is about 1 unit-cell thick.

5. The high-temperature superconducting film of claim 1, wherein an atomically smooth interface is between the SrTiO$_3$ substrate and the single crystalline FeSe layer.

6. The high-temperature superconducting film of claim 5, wherein the atomically smooth interface is a superconducting interface.

7. The high-temperature superconducting film of claim 1, wherein a thickness of the single crystalline FeSe layer is in a range from about 1 unit-cell thick to about 5 unit-cells thick.

8. The high-temperature superconducting film of claim 1, wherein an atomically smooth interface is between the protective layer and the single crystalline FeSe layer.

9. The high-temperature superconducting film of claim 1, wherein an onset temperature of superconducting transition of the high-temperature superconducting film is greater than or equal to 54 K, and a critical current density of the high-temperature superconducting film is about 10$^6$ A/cm$^2$ at 12 K.

10. A high-temperature superconducting film, comprising: a SrTiO$_3$ substrate, a single crystalline FeSe layer, and a single crystalline FeTe layer, wherein the single crystalline FeSe layer is sandwiched between the SrTiO$_3$ substrate and the single crystalline FeTe layer via a layer-by-layer mode.

11. The high-temperature superconducting film of claim 10, wherein a thickness of the single crystalline FeTe layer is in a range from about 2 unit-cells thick to about 10 unit-cells thick.

12. The high-temperature superconducting film of claim 11, wherein a thickness of the single crystalline FeTe layer is about 10 unit-cells thick, and a thickness of the single crystalline FeSe layer is about 1 unit-cell thick.

13. The high-temperature superconducting film of claim 10, a thickness of the single crystalline FeSe layer is in a range from about 1 unit-cell thick to about 5 unit-cells thick.

14. The high-temperature superconducting film of claim 10, wherein an atomically smooth interface is between the SrTiO$_3$ substrate and the single crystalline FeSe layer.

15. The high-temperature superconducting film of claim 10, wherein a superconducting interface is between the SrTiO$_3$ substrate and the single crystalline FeSe layer.

16. The high-temperature superconducting film of claim 10, wherein an atomically smooth interface is between the protective layer and the single crystalline FeSe layer.

17. The high-temperature superconducting film of claim 10, wherein an onset temperature of superconducting transition of the high-temperature superconducting film is greater than or equal to 54 K, and a critical current density of the high-temperature superconducting film is about 10$^6$ A/cm$^2$ at 12 K.

18. A high-temperature superconducting film, comprising: a SrTiO$_3$ substrate, a single crystalline FeSe layer, and a protective layer with a layered crystal structure, wherein the single crystalline FeSe layer is sandwiched between the SrTiO$_3$ substrate and the protective layer, the single crystalline FeSe layer is grown on the SrTiO$_3$ substrate via a layer-by-layer mode; and the protective layer is formed by a tetragonal lattice layered compound AB, A is a transition metal; and B is selenium, tellurium, or sulfur.

19. The high-temperature superconducting film of claim 18, wherein the protective layer is grown on the single crystalline FeSe layer.

* * * * *